United States Patent
Kim et al.

(10) Patent No.: US 9,368,482 B2
(45) Date of Patent: *Jun. 14, 2016

(54) STACK PACKAGES AND METHODS OF FABRICATING THE SAME

(71) Applicant: SK hynix Inc., Icheon-si Gyeonggi-do (KR)

(72) Inventors: Jong Hoon Kim, Suwon-si (KR); Han Jun Bae, Icheon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/935,105

(22) Filed: Nov. 6, 2015

(65) Prior Publication Data

US 2016/0064359 A1 Mar. 3, 2016

Related U.S. Application Data

(63) Continuation of application No. 14/245,618, filed on Apr. 4, 2014, now Pat. No. 9,214,410.

(30) Foreign Application Priority Data

Jul. 25, 2013 (KR) .................... 10-2013-0088355

(51) Int. Cl.
*H01L 23/48* (2006.01)
*H01L 25/065* (2006.01)
(Continued)

(52) U.S. Cl.
CPC .......... *H01L 25/0657* (2013.01); *H01L 23/481* (2013.01); *H01L 24/13* (2013.01); *H01L 24/81* (2013.01); *H01L 25/0652* (2013.01); *H01L 25/50* (2013.01); *H01L 23/3128* (2013.01); *H01L 23/3171* (2013.01); *H01L 24/05* (2013.01); *H01L 24/06* (2013.01); *H01L 24/11* (2013.01); *H01L 24/16* (2013.01); *H01L 25/18* (2013.01); *H01L 2224/0401* (2013.01); *H01L 2224/05009* (2013.01); *H01L 2224/0557* (2013.01); *H01L 2224/05605* (2013.01); *H01L 2224/05609* (2013.01); *H01L 2224/05611* (2013.01); *H01L 2224/05613* (2013.01); *H01L 2224/05616* (2013.01); *H01L 2224/05618* (2013.01);
(Continued)

(58) Field of Classification Search
CPC .............................. H01L 23/481; H01L 24/81
See application file for complete search history.

(56) References Cited

U.S. PATENT DOCUMENTS

| 2009/0014205 | A1* | 1/2009 | Kobayashi | ........... H05K 3/0052 174/255 |
| 2010/0059897 | A1* | 3/2010 | Fay | .......... H01L 24/03 257/777 |

(Continued)

*Primary Examiner* — Christine Enad
(74) *Attorney, Agent, or Firm* — William Park & Associates Ltd.

(57) ABSTRACT

Stack packages are provided. The stack package includes a first chip configured to include a first chip body having a top surface and a bottom surface, first through electrodes penetrating the first chip body, and an insulation layer disposed on the bottom surface of the first chip body, and first bumps disposed on the top surface of the first chip body, and a second chip configured to include a second chip body having a top surface and a bottom surface, and second bumps disposed on the top surface of the second chip body. The first and second chips are vertically stacked such that the top surface of the second chip body is directly attached to the first insulation layer and the second bumps of the second chip penetrate the first insulation layer of the first chip to pierce the first through electrodes of the first chip.

10 Claims, 8 Drawing Sheets

(51) Int. Cl.
  *H01L 25/00* (2006.01)
  *H01L 23/00* (2006.01)
  *H01L 23/31* (2006.01)
  *H01L 25/18* (2006.01)

(52) U.S. Cl.
  CPC ............... *H01L2224/05623* (2013.01); *H01L 2224/05624* (2013.01); *H01L 2224/05639* (2013.01); *H01L 2224/05644* (2013.01); *H01L 2224/05647* (2013.01); *H01L 2224/06181* (2013.01); *H01L 2224/11462* (2013.01); *H01L 2224/13016* (2013.01); *H01L 2224/13017* (2013.01); *H01L 2224/13147* (2013.01); *H01L 2224/16146* (2013.01); *H01L 2224/16147* (2013.01); *H01L 2224/16225* (2013.01); *H01L 2224/16235* (2013.01); *H01L 2224/16237* (2013.01); *H01L 2224/81203* (2013.01); *H01L 2224/81898* (2013.01); *H01L 2224/94* (2013.01); *H01L 2225/06513* (2013.01); *H01L 2225/06517* (2013.01); *H01L 2225/06541* (2013.01); *H01L 2225/06565* (2013.01); *H01L 2924/15311* (2013.01)

(56) References Cited

U.S. PATENT DOCUMENTS

| 2012/0077314 | A1* | 3/2012 | Park | H01L 25/0657 438/109 |
|---|---|---|---|---|
| 2012/0205816 | A1* | 8/2012 | Son | H01L 21/76898 257/774 |
| 2012/0282735 | A1* | 11/2012 | Ahn | H01L 21/76898 438/109 |
| 2013/0070436 | A1* | 3/2013 | Sutanto | B23K 1/20 361/760 |
| 2013/0256872 | A1* | 10/2013 | Su | H01L 23/3677 257/737 |

* cited by examiner

STACK PACKAGES AND METHODS OF FABRICATING THE SAME

CROSS-REFERENCE TO RELATED APPLICATION

This is a continuation application of U.S. present application Ser. No. 14/245,618 filed on Apr. 4, 2014, entitled STACK PACKAGES AND METHODS OF FABRICATING THE SAME.

BACKGROUND

1. Technical Field

Embodiments of the present disclosure relate to semiconductor packages and methods of fabricating the same and, more particularly, to stack packages and methods of fabricating the same.

2. Related Art

In the electronics industry, small, thin and light semiconductor packages are increasingly in demand with the development of smaller, faster, multi-functional and higher performance portable electronic products. In general, the semiconductor package includes a single semiconductor chip. Recently, however, stack packages have been developed to realize high performance electronic systems. Each of the stack packages may include a plurality of semiconductor chips having different functions.

To fabricate the stack packages, through electrodes (in some cases, referred to as "through silicon vias") penetrating each of the semiconductor chips may be formed and the semiconductor chips may be stacked such that the through electrodes of the semiconductor chips are vertically aligned with each other to electrically couple the semiconductor chips. In the event that the through electrodes are used in the semiconductor packages, a length of interconnection lines, for example, wires may be remarkably reduced to improve electrical characteristics of the semiconductor packages. Further, if the through electrodes are applied in the semiconductor packages, the semiconductor packages, for example, the stack packages may be formed to have a compact size.

SUMMARY

Example embodiments are directed to stack packages and methods of fabricating the same.

According to an embodiment, a stack package includes a first chip configured to include a first chip body having a top surface and a bottom surface, first through electrodes penetrating the first chip body, and an insulation layer disposed on the bottom surface of the first chip body, and first bumps disposed on the top surface of the first chip body, and a second chip configured to include a second chip body having a top surface and a bottom surface, and second bumps disposed on the top surface of the second chip body. The first and second chips are vertically stacked such that the top surface of the second chip body is directly attached to the first insulation layer and the second bumps of the second chip penetrate the first insulation layer of the first chip to pierce the first through electrodes of the first chip.

BRIEF DESCRIPTION OF THE DRAWINGS

Embodiments of the present invention will become more apparent in view of the attached drawings and accompanying detailed description, in which.

DESCRIPTION OF SPECIFIC EMBODIMENTS

In the present application, spatially relative terms, such as "beneath", "below", "lower", "above", "upper", "top", "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. As used herein, "height" refers to a direction that is generally orthogonal to the faces of a substrate.

Figure 1:
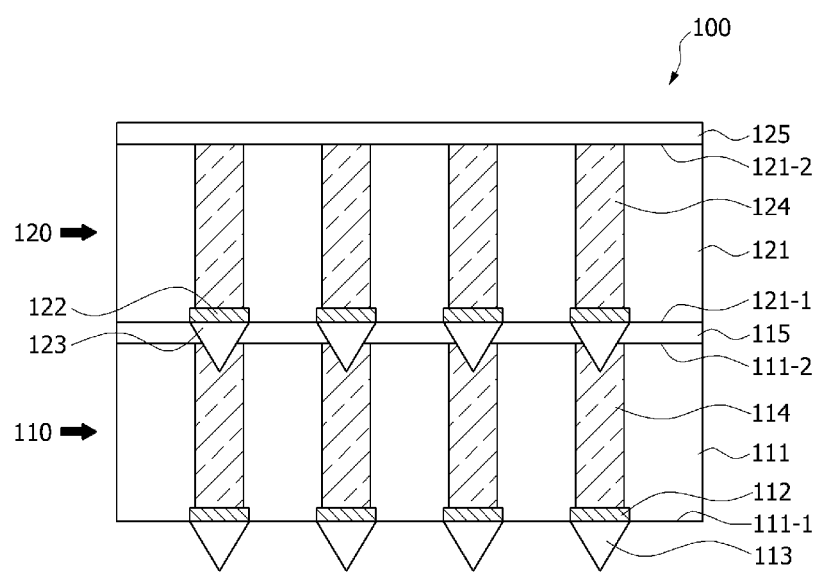
FIG. 1 is a cross-sectional view illustrating a stack package according to an embodiment of the present invention.

Referring to FIG. 1, a stack package 100 according to the present embodiment may include a first chip 110 and a second chip 120 which are vertically stacked. The first chip 110 may include a first chip body 111 having a top surface 111-1 and a bottom surface 111-2 that are opposite to each other. In an embodiment, the first chip body 111 may include a semiconductor material, such as a silicon material. Although not shown in the drawings, an active layer in which active elements and/or passive elements are formed may be disposed in the first chip body 111 to be adjacent to the top surface 111-1 of the first chip body 111. A plurality of first electrodes 112 may be disposed on the top surface 111-1 of the first chip body 111. Each of the first electrodes 112 may include a metal material such as an aluminum material or a copper material. First bumps 113 may be disposed on respective ones of the first electrodes 112 opposite to the bottom surface 111-2. That is, the first bumps 113 may be contacted to the first electrodes 112, respectively. In an embodiment, each of the first bumps 113 may include a metal material having a high solidity, for example, a copper material. The first bumps 113 may protrude from the top surface 111-1 of the first chip body 111. A horizontal cross-sectional area of a lower portion of each first bump 113 may be greater than a horizontal cross-sectional area of an upper portion thereof. For example, the horizontal cross-sectional area of each first bump 113 may gradually increase as a horizontal cross-sectional plane becomes closer to the top surface 111-1 of the first chip body 111. That is, a width of each first bump 113 may be gradually reduced as it becomes far from the first electrode 112. Thus, each of the first bumps 113 may have a substantially reversed circular cone shape, as illustrated in FIG. 1.

A plurality of first through electrodes 114 may be disposed to vertically penetrate the first chip body 111 between the top and bottom surfaces 111-1 and 111-2. In an embodiment, each of the first through electrodes 114 may have a uniform width or diameter. Although not shown in the drawings, an insulation layer may be disposed between each first through electrode 114 and the first chip body 111. Each of the first through electrodes 114 may include a conductive material having a low melting point, for example, a melting temperature of about −40 degrees Celsius to about 400 degrees Celsius. In an embodiment, each of the first through electrodes 114 may be formed of matrial selected from the group consisting of a gallium (Ga) material, an indium (In) material, a tin (Sn) material, a silver (Ag) material, a copper (Cu) material, a mercury (Hg) material, a bismuth (Bi) material, a lead (Pb) material, a gold (Au) material, a zinc (Zn) material, a potassium (K) material, a sodium (Na) material, a magnesium (Mg) material, and an aluminum (Al) material, and combinations thereof. First ends of the first through electrodes 114 may be electrically connected to respective ones of the first electrodes 112. Although FIG. 1 illustrates an example that the first through electrodes 114 directly contact the first electrodes 112, the present embodiment is not limited thereto. That is, the first through electrodes 114 may be electrically connected to respective ones of the first electrodes 112 through other interconnection lines. In such a case, the first ends of the first through electrodes 114 may directly contact the other interconnection lines. A first insulation layer 115 may be disposed on the bottom surface 111-2 of the first chip body 111. In an embodiment, the first insulation layer 115 may be a non-conductive film (NCF) material or a non-conductive paste (NCP) material having a thickness of about 20 um to about 80 um. In other embodiment, the first insulation layer 115 may be a silicon oxide layer or a nitride layer having a thickness of about 0.05 um to about 4 um. In the case of employing the silicon oxide layer or a nitride layer as the first insulation layer 115, a thickness of the stack package 100 may be reduced as compared with stack packages employing the non-conductive film (NCF) material or the non-conductive paste (NCP) material as the first insulation layer 115. In addition, if the first insulation layer 115 is formed of a silicon oxide layer or a nitride layer, a difference between a thermal expansion coefficient of the first insulation layer 115 and a thermal expansion coefficient of another material (e.g., the first chip body 111) may be reduced such that the reliability of the stack package 100 would be improved.

The second chip 120 may be disposed on the first insulation layer 115. For example, the second chip 120 may be disposed over the bottom surface 112-2 of the first chip 110. The second chip 120 may include a second chip body 121 having a top surface 121-1 and a bottom surface 121-2 that are opposite to each other. The top surface 121-1 of the second chip body 121 may face to the bottom surface 111-2 of the first chip body 111 with interposing the first insulation layer 115. In an embodiment, the second chip body 121 may include a semiconductor material, such as a silicon material. Although not shown in the drawings, an active layer in which active elements and/or passive elements are formed may be disposed in the second chip body 121 to be adjacent to the top surface 121-1. A plurality of second electrodes 122 may be disposed on the top surface 121-1 of the second chip body 121. Each of the second electrodes 122 may include a metal material such as an aluminum material or a copper material. Second bumps 123 may be disposed on respective ones of the second electrodes 122 opposite to the bottom surface 121-2. That is, the second bumps 123 may be contacted to the second electrodes 122, respectively. In an embodiment, each of the second bumps 123 may include a metal material having a high solidity, for example, a copper material. The second bumps 123 may protrude from the top surface 121-1 of the second chip body 121. A horizontal cross-sectional area of a lower portion of each second bump 123 may be greater than a horizontal cross-sectional area of an upper portion thereof. For example, the horizontal cross-sectional area of each second bump 123 may gradually increase as a horizontal cross-sectional plane becomes closer to the top surface 121-1 of the second chip body 121. That is, a width of each second bump 123 may be gradually reduced as it becomes far from the second electrode 122. Thus, each of the second bumps 123 may have a substantially reversed circular cone shape, as illustrated in FIG. 1, as like the first bump 113.

A plurality of second through electrodes 124 may be disposed to vertically penetrate the second chip body 121 between the top and bottom surfaces 121-1 and 121-2. In an embodiment, each of the second through electrodes 124 may have a uniform width or diameter. Although not shown in the drawings, an insulation layer may be disposed between each second through electrode 124 and the second chip body 121. Each of the second through electrodes 124 may include a conductive material having a low melting point, for example, a melting temperature of about −40 degrees Celsius to about 400 degrees Celsius. In an embodiment, each of the second through electrodes 124 may be formed of matrial selected from the group consisting of a gallium (Ga) material, an indium (In) material, a tin (Sn) material, a silver (Ag) material, a copper (Cu) material, a mercury (Hg) material, a bismuth (Bi) material, a lead (Pb) material, a gold (Au) material, a zinc (Zn) material, a potassium (K) material, a sodium (Na) material, a magnesium (Mg) material, and an aluminum (Al) material, and combinations thereof. First ends of the second through electrodes 124 may be electrically connected to respective ones of the second electrodes 122. Although FIG. 1 illustrates an example that the second through electrodes 124 directly contact the second electrodes 122, the present embodiment is not limited thereto. That is, the second through electrodes 124 may be electrically connected to respective ones of the second electrodes 122 through other interconnection lines. In such a case, the first ends of the second through electrodes 124 may directly contact the other interconnection lines. A second insulation layer 125 may be disposed on the bottom surface 121-2 of the second chip body 121 opposite to the top surface 121-1. In an embodiment, the second insulation layer 125 may be a non-conductive film (NCF) material or a non-conductive paste (NCP) material having a thickness of about 20 um to about 80 um. In other embodiment, the second insulation layer 125 may be a silicon oxide layer or a nitride layer having a thickness of about 0.05 um to about 4 um.

The second bumps 123 may penetrate the first insulation layer 115 to pierce respective ones of the first through electrodes 114, and the top surface 121-1 of the second chip body 121 may directly contact the first insulation layer 115. Since the second bumps 123 penetrate the first insulation layer 115 to pierce the first through electrodes 114, coherence of the second chip body 121 and the first insulation layer 115, for example, a characteristic of bonding between the second chip body 121 and the first insulation layer 115 may be improved. In particular, even though each of the second bumps 123 has different size, for example, different height, the non-contact of the second bump 123 having a low height and the first through electrode 114 is prevented. The first chip 110 may have the same function and configuration as the second chip 120. Alternatively, the first and second chips 110 and 120 may have different functions or different configurations from each other. In an embodiment, the first and second chips 110 and 120 may be memory chips such as dynamic random access memory (DRAM) chips or flash memory chips. Although FIG. 1 illustrates an example that two chips are stacked, the present embodiment is not limited thereto. For example, the present embodiment is applicable to the stack packages including three or more stacked chips.

Figure 2:
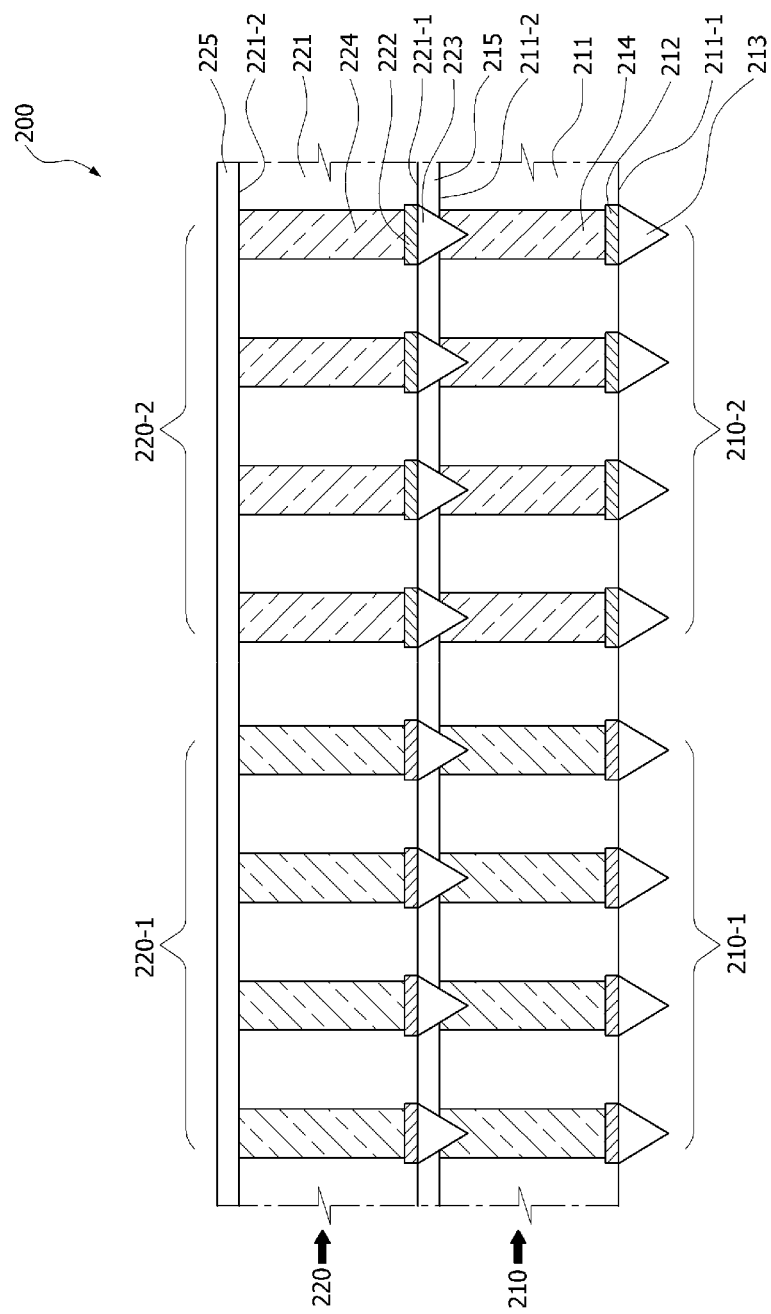
FIG. 2 is a cross-sectional view illustrating a stack package according to an embodiment of the present invention.

Referring to FIG. 2, a stack package 200 may include two or more wafers sequentially stacked. Specifically, the stack package 200 may have a structure that a first wafer 210 and a second wafer 220 are vertically stacked. Each of the first and second wafers 210 and 220 may include a silicon material or another semiconductor material. A plurality of unit devices 210-1 and 210-2 may be disposed in the first wafer 210, and the unit devices 210-1 and 210-2 in the first wafer 210 may be simultaneously formed by the same fabrication process. Thus, the unit devices 210-1 and 210-2 may have the same structure. Similarly, a plurality of unit devices 220-1 and 220-2 may be disposed in the second wafer 220, and the unit devices 220-1 and 220-2 in the second wafer 220 may be simultaneously formed by the same fabrication process. Thus, the unit devices 220-1 and 220-2 may also have the same structure. The unit devices 210-1, 210-2, 220-1 and 220-2 may be separated from each other using a separation process such as a die sawing process. In such a case, each of the separated unit devices 210-1, 210-2, 220-1 and 220-2 may be used as any one of the first and second chips 110 and 120 described with reference to FIG. 1.

The first wafer 210 may include a first wafer body 211 having a top surface 211-1 and a bottom surface 211-2 that are opposite to each other. Although not shown in the drawings, an active layer in which active elements and/or passive elements are formed may be disposed in the first wafer body 211 to be adjacent to the top surface 211-1. A plurality of first electrodes 212 may be disposed on the top surface 211-1 of the first wafer body 211. Each of the first electrodes 212 may include a metal material such as an aluminum material or a copper material. First bumps 213 may be disposed on respective ones of the first electrodes 212 opposite to the bottom surface 211-2. That is, the first bumps 213 may be contacted to the first electrodes 212, respectively. In an embodiment, each of the first bumps 213 may include a metal material having a high solidity, for example, a copper material. The first bumps 213 may protrude from the top surface 211-1 of the first wafer body 211. A horizontal cross-sectional area of a lower portion of each first bump 213 may be greater than a horizontal cross-sectional area of an upper portion thereof. For example, the horizontal cross-sectional area of each first bump 213 may gradually increase as a horizontal cross-sectional plane becomes closer to the top surface 211-1 of the first wafer body 211. That is, a width of each first bump 213 may be gradually reduced as it becomes far from the first electrode 212. Thus, each of the first bumps 213 may have a reversed circular cone shape, as illustrated in FIG. 2.

A plurality of first through electrodes 214 may be disposed to vertically penetrate the first wafer body 211 between the top and bottom surfaces 211-1 and 211-2. In an embodiment, each of the first through electrodes 214 may have a uniform width or diameter. Although not shown in the drawings, an insulation layer may be disposed between each first through electrode 214 and the first wafer body 211. Each of the first through electrodes 214 may include a conductive material having a low melting point, for example, a melting temperature of about −40 degrees Celsius to about 400 degrees Celsius. In an embodiment, each of the first through electrodes 214 may be formed of matrial selected from the group consisting of a gallium (Ga) material, an indium (In) material, a tin (Sn) material, a silver (Ag) material, a copper (Cu) material, a mercury (Hg) material, a bismuth (Bi) material, a lead (Pb) material, a gold (Au) material, a zinc (Zn) material, a potassium (K) material, a sodium (Na) material, a magnesium (Mg) material, and an aluminum (Al) material, and combinations thereof. First ends of the first through electrodes 214 may be electrically connected to respective ones of the first electrodes 212. Although FIG. 2 illustrates an example that the first through electrodes 214 directly contact the first electrodes 212, the present embodiment is not limited thereto. That is, the first through electrodes 214 may be electrically connected to respective ones of the first electrodes 212 through other interconnection lines. In such a case, the first ends of the first through electrodes 214 may directly contact the other interconnection lines. A first insulation layer 215 may be disposed on the bottom surface 211-2 of the first wafer body 211 opposite to the top surface 211-1. In an embodiment, the first insulation layer 215 may be a silicon oxide layer or a nitride layer. In such a case, a thickness of the stack package 200 may be reduced as compared with stack packages employing a non-conductive film (NCF) material or a non-conductive paste (NCP) material as the first insulation layer 215. In addition, if the first insulation layer 215 is formed of a silicon oxide layer, a difference between a thermal expansion coefficient of the first insulation layer 215 and a thermal expansion coefficient of another material (e.g., the first wafer body 211) may be reduced such that the reliability of the stack package 200 would be improved.

The second wafer 220 may be disposed on a surface of the first insulation layer 215. For example, the second wafer 220 may be disposed over the bottom surface 211-2 of the first wafer body 211. The second wafer 220 may include a second wafer body 221 having a top surface 221-1 and a bottom surface 221-2 that are opposite to each other. The top surface 221-1 of the second wafer body 221 may face to the bottom surface 211-2 of the first wafer body 211 with interposing the first insulation layer 215. In an embodiment, the second wafer body 221 may include a semiconductor material, such as a silicon material. Although not shown in the drawings, an active layer in which active elements and/or passive elements are formed may be disposed in the second wafer body 221 to be adjacent to the top surface 221-1. A plurality of second electrodes 222 may be disposed on the top surface 221-1 of the second wafer body 221. Each of the second electrodes 222 may include a metal material such as an aluminum material or a copper material. Second bumps 223 may be disposed on respective ones of the second electrodes 222 opposite to the bottom surface 221-2. That is, the second bumps 223 may be contacted to the second electrodes 222, respectively. In an embodiment, each of the second bumps 223 may include a metal material having a high solidity, for example, a copper material. The second bumps 223 may protrude from the top surface 221-1 of the second wafer body 221. A horizontal cross-sectional area of a lower portion of each second bump 223 may be greater than a horizontal cross-sectional area of an upper portion thereof. For example, the horizontal cross-sectional area of each second bump 223 may gradually increase as a horizontal cross-sectional plane becomes closer to the top surface 221-1 of the second wafer body 221. That is, a width of each second bump 223 may be gradually reduced as it becomes far from the second electrode 222. Thus, each of the second bumps 223 may have a substantially reversed circular cone shape, as illustrated in FIG. 2, as like the first bump 213.

A plurality of second through electrodes 224 may be disposed to vertically penetrate the second wafer body 221 between the top and bottom surfaces 221-1 and 221-2. In an embodiment, each of the second through electrodes 224 may have a uniform width or diameter. Although not shown in the drawings, an insulation layer may be disposed between each second through electrode 224 and the second wafer body 221. Each of the second through electrodes 224 may include a conductive material having a low melting point, for example, a melting temperature of about −40 degrees Celsius to about 400 degrees Celsius. In an embodiment, each of the second through electrodes 224 may be formed of matrial selected from the group consisting of a gallium (Ga) material, an indium (In) material, a tin (Sn) material, a silver (Ag) material, a copper (Cu) material, a mercury (Hg) material, a bismuth (Bi) material, a lead (Pb) material, a gold (Au) material, a zinc (Zn) material, a potassium (K) material, a sodium (Na) material, a magnesium (Mg) material, and an aluminum (Al) material, and combinations thereof. First ends of the second through electrodes 224 may be electrically connected to respective ones of the second electrodes 222. Although FIG. 2 illustrates an example that the second through electrodes 224 directly contact the second electrodes 222, the present embodiment is not limited thereto. That is, the second through electrodes 224 may be electrically connected to respective ones of the second electrodes 222 through other interconnection lines. In such a case, the first ends of the second through electrodes 224 may directly contact the other interconnection lines. A second insulation layer 225 may be disposed on the bottom surface 221-2 of the second wafer body 221. In an embodiment, the second insulation layer 225 may be a silicon oxide layer or a nitride layer.

The second bumps 223 may penetrate the first insulation layer 215 to pierce respective ones of the first through electrodes 214, and the top surface 221-1 of the second wafer body 221 may directly contact the first insulation layer 215. Since the second bumps 223 of the second wafer 220 penetrate the first insulation layer 215 to pierce the first through electrodes 214, coherence of the second wafer body 221 and the first insulation layer 215, for example, a characteristic of bonding between the second wafer body 221 and the first insulation layer 215 may be improved. In particular, even though each of the second bumps 223 has different size, for example, different height, the non-contact of the second bump 223 having a low height and the first through electrode 214 is prevented. The stack package 100 illustrated in FIG. 1 is configured to include a plurality of chips which are stacked, whereas the stack package 200 illustrated in FIG. 2 may be configured to include a plurality of wafers. Thus, the number of the bumps in the stack package 200 may be greater than the number of the bumps in the stack package 100, and a deviation of heights of the bumps in the stack package 200 may also be greater than a deviation of heights of the bumps in the stack package 100. In the case of the stack package 200, the non-contact of the second bump 223 having a low height and the first through electrode 214 is prevented. Although FIG. 2 illustrates an example that two wafers are stacked, the present embodiment is not limited thereto. For example, the present embodiment is applicable to the stack packages including three or more stacked wafers.

Figure 3:
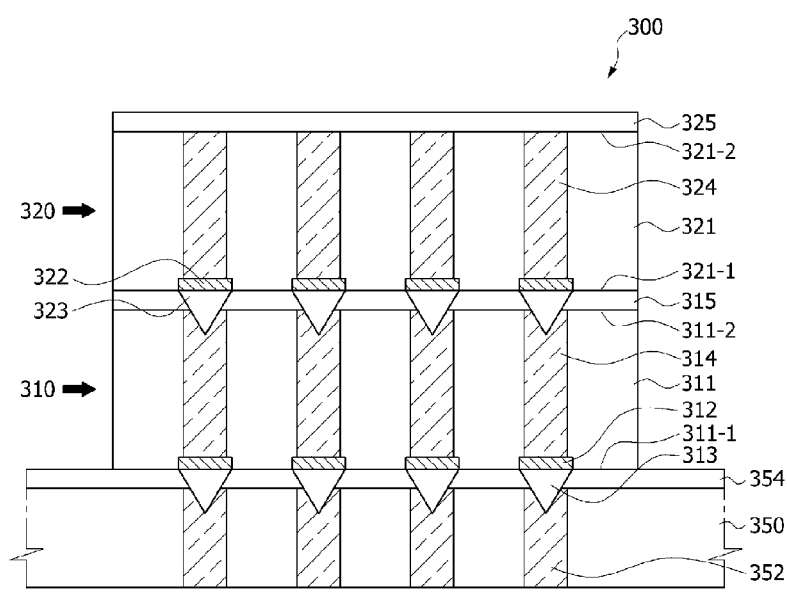
FIG. 3 is a cross-sectional view illustrating a stack package according to an embodiment of the present invention.

Referring to FIG. 3, a stack package 300 may be configured to include a substrate 350, a first chip 310 stacked on the substrate 350, and a second chip 320 stacked on a surface of the first chip 310. Although FIG. 3 illustrates an example that two chips 310 and 320 are stacked on the substrate 350, the present embodiment is not limited thereto. For example, the present embodiment is applicable to the stack packages including three or more chips stacked on the substrate 350. A plurality of through electrodes 352 may be disposed to vertically penetrate the substrate 350. In an embodiment, each of the through electrodes 352 may include a metal alloy material containing a metal having a relatively high conductivity and a metal having a relatively low melting point. The metal having a relatively high conductivity may include a copper material, and the metal having a relatively low melting point may be formed of material selected from the group consisting of of a mercury (Hg) material, a potassium (K) material, a sodium (Na) material, a tin (Sn) material, a lead (Pb) material, a magnesium (Mg) material and an aluminum (Al) material, and combinations thereof. An insulation layer 354 may be disposed on a surface of the substrate 350. In an embodiment, the insulation layer 354 may include a silicon oxide layer. The substrate 350 may be attached to a mother board or another substrate. To this end, although not shown in the drawings, bonding member such as solder balls may be attached to exposed surfaces of through electrodes 352. In an embodiment, the substrate 350 may be an interposer or a logic chip. In such a case, the substrate 350, that is, the interposer may be attached to another substrate.

The first chip 310 attached to the substrate 350 may include a first chip body 311 having a top surface 311-1 and a bottom surface 311-2 that are opposite to each other. In an embodiment, the first chip body 311 may include a semiconductor material, such as a silicon material. Although not shown in the drawings, an active layer in which active elements and/or passive elements are formed may be disposed in the first chip body 311 to be adjacent to the top surface 311-1 of the first chip body 311. A plurality of first electrodes 312 may be disposed on the top surface 311-1 of the first chip body 311. Each of the first electrodes 312 may include a metal material such as an aluminum material or a copper material. First bumps 313 may be disposed on respective ones of the first electrodes 312 opposite to the bottom surface 311-2. That is, the first bumps 313 may be contacted to the first electrodes 312, respectively. In an embodiment, each of the first bumps 313 may include a metal material having a high solidity, for example, a copper material. The first bumps 313 may protrude from the top surface 311-1 of the first chip body 311 having top surfaces of the first electrodes 312. A horizontal cross-sectional area of a lower portion of each first bump 313 may be greater than a horizontal cross-sectional area of an upper portion thereof. For example, the horizontal cross-sectional area of each first bump 313 may gradually increase as a horizontal cross-sectional plane becomes closer to the top surface 311-1 of the first chip body 311. That is, a width of each first bump 313 may be gradually reduced as it becomes far from the first electrode 312. Thus, each of the first bumps 313 may have a substantially reversed circular cone shape, as illustrated in FIG. 3. The first bumps 313 may penetrate the insulation layer 354 on the substrate 350 to infiltrate into respective ones of the through electrodes 352 in the substrate 350.

A plurality of first through electrodes 314 may be disposed to vertically penetrate the first chip body 311 between the top and bottom surfaces 311-1 and 311-2. In an embodiment, each of the first through electrodes 314 may have a uniform width or diameter. Although not shown in the drawings, an insulation layer may be disposed between each first through electrode 314 and the first chip body 311. Each of the first through electrodes 314 may include a conductive material having a low melting point, for example, a melting temperature of about −40 degrees Celsius to about 400 degrees Celsius. In an embodiment, each of the first through electrodes 114 may be formed of matrial selected from the group consisting of a gallium (Ga) material, an indium (In) material, a tin (Sn) material, a silver (Ag) material, a copper (Cu) material, a mercury (Hg) material, a bismuth (Bi) material, a lead (Pb) material, a gold (Au) material, a zinc (Zn) material, a potassium (K) material, a sodium (Na) material, a magnesium (Mg) material, and an aluminum (Al) material, and combinations thereof. First ends of the first through electrodes 314 may be electrically connected to respective ones of the first electrodes 312. Although FIG. 3 illustrates an example that the first through electrodes 314 directly contact the first electrodes 312, the present embodiment is not limited thereto. That is, the first through electrodes 314 may be electrically connected to respective ones of the first electrodes 312 through other interconnection lines. In such a case, the first ends of the first through electrodes 314 may directly contact the other interconnection lines. A first insulation layer 315 may be disposed on the bottom surface 311-2 of the first chip body 311 opposite to the top surface 311-1. In an embodiment, the first insulation layer 315 may be a silicon oxide layer or a nitride layer. In such a case, a thickness of the stack package 300 may be reduced as compared with stack packages employing a non-conductive film (NCF) material or a non-conductive paste (NCP) material as the first insulation layer 315. In addition, if the first insulation layer 315 is formed of a silicon oxide layer, a difference between a thermal expansion coefficient of the first insulation layer 315 and a thermal expansion coefficient of another material (e.g., the first chip body 311) may be reduced to improve the reliability of the stack package 300.

The second chip 320 may be disposed on a surface of the first insulation layer 315. For example, the second chip 320 may be disposed over the bottom surface 312-2 of the first chip 310. The second chip 320 may include a second chip body 321 having a top surface 321-1 and a bottom surface 321-2 that are opposite to each other. The top surface 321-1 of the second chip body 321 may face to the bottom surface 311-2 of the first chip body 311 with interposing the first insulation layer 315. In an embodiment, the second chip body 321 may include a semiconductor material, such as a silicon material. Although not shown in the drawings, an active layer in which active elements and/or passive elements are formed may be disposed in the second chip body 321 to be adjacent to the top surface 321-1. A plurality of second electrodes 322 may be disposed on the top surface 321-1 of the second chip body 321. Each of the second electrodes 322 may include a metal material such as an aluminum material or a copper material. Second bumps 323 may be disposed on respective ones of the second electrodes 322 opposite to the bottom surface 321-2. That is, the second bumps 323 may be contacted to the second electrodes 322, respectively. In an embodiment, each of the second bumps 323 may include a metal material having a high solidity, for example, a copper material. The second bumps 323 may protrude from the top surface 321-1 of the second chip body 321 and top surfaces of the second electrodes 322. A horizontal cross-sectional area of a lower portion of each second bump 323 may be greater than a horizontal cross-sectional area of an upper portion thereof. For example, the horizontal cross-sectional area of each second bump 323 may gradually increase as a horizontal cross-sectional plane becomes closer to the top surface 321-1 of the second chip body 321. That is, a width of each second bump 323 may be gradually reduced as it becomes far from the second electrode 322. Thus, each of the second bumps 323 may have a reversed circular cone shape, as illustrated in FIG. 3, as like the first bump 113.

A plurality of second through electrodes 324 may be disposed to vertically penetrate the second chip body 321 between the top and bottom surfaces 321-1 and 321-2. In an embodiment, each of the second through electrodes 324 may have a uniform width or diameter. Although not shown in the drawings, an insulation layer may be disposed between each second through electrode 324 and the second chip body 321. Each of the second through electrodes 324 may include a conductive material having a low melting point, for example, a melting temperature of about −40 degrees Celsius to about 400 degrees Celsius. In an embodiment, each of the second through electrodes 324 may be formed of matrial selected from the group consisting of a gallium (Ga) material, an indium (In) material, a tin (Sn) material, a silver (Ag) material, a copper (Cu) material, a mercury (Hg) material, a bismuth (Bi) material, a lead (Pb) material, a gold (Au) material, a zinc (Zn) material, a potassium (K) material, a sodium (Na) material, a magnesium (Mg) material, and an aluminum (Al) material, and combinations thereof. First ends of the second through electrodes 324 may be electrically connected to respective ones of the second electrodes 322. Although FIG. 3 illustrates an example that the second through electrodes 324 directly contact the second electrodes 322, the present embodiment is not limited thereto. That is, the second through electrodes 324 may be electrically connected to respective ones of the second electrodes 322 through other interconnection lines. In such a case, the first ends of the second through electrodes 324 may directly contact the other interconnection lines. A second insulation layer 325 may be disposed on the bottom surface 321-2 of the second chip body 321 opposite to the top surface 321-1. In an embodiment, the second insulation layer 325 may be a silicon oxide layer or a nitride layer.

The second bumps 323 may penetrate the first insulation layer 315 to pierce respective ones of the first through electrodes 314, and the top surface 321-1 of the second chip body 321 may directly contact the first insulation layer 315. Since the second bumps 323 of the second chip 320 penetrate the first insulation layer 315 to pierce the first through electrodes 314, coherence of the second chip body 321 and the first insulation layer 315, for example, a characteristic of bonding between the second chip body 321 and the first insulation layer 315 may be improved. In particular, even though the second bumps 323 have different sizes, for example, different heights, the non-contact of the second bump 323 having a low height and the first through electrode 314 is prevented. The first chip 310 may have the same function and configuration as the second chip 320. Alternatively, the first and second chips 310 and 320 may have different functions or different configurations from each other. In an embodiment, the first and second chips 310 and 320 may be memory chips such as DRAM chips or flash memory chips.

Figure 4:
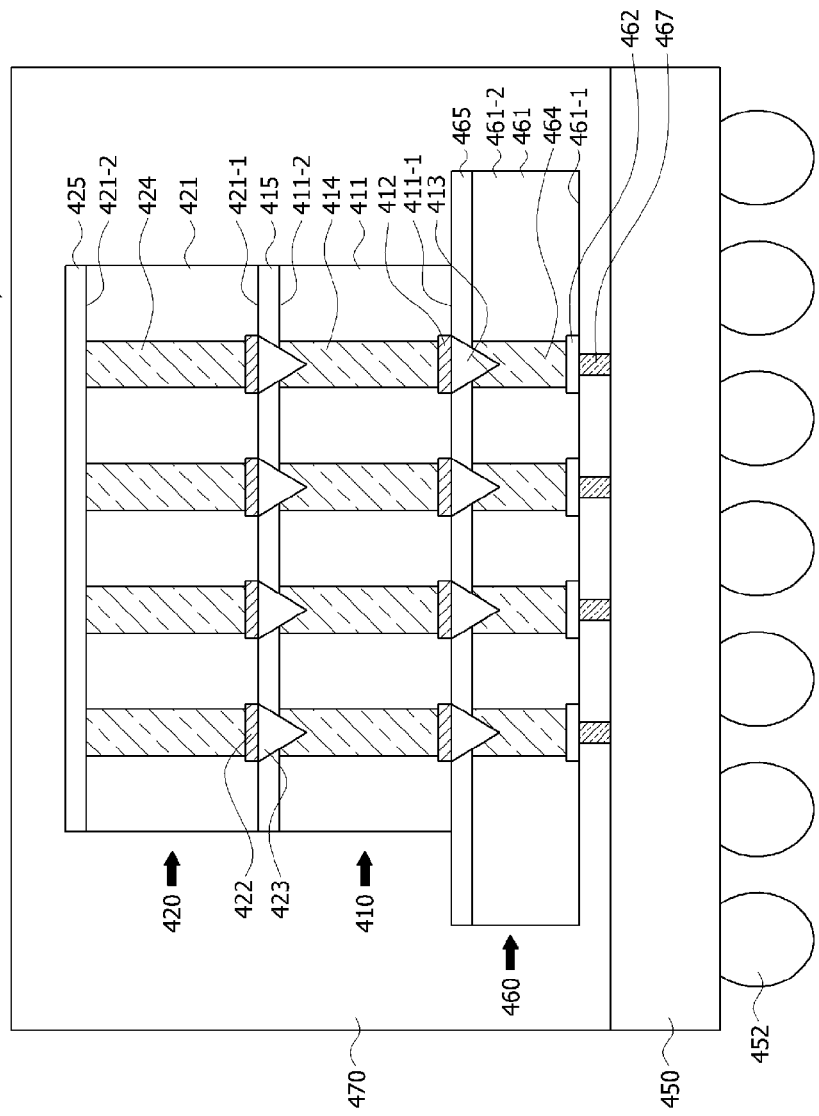
FIG. 4 is a cross-sectional view illustrating a stack package according to an embodiment of the present invention.

Referring to FIG. 4, a stack package 400 may be a system integrated circuit package including a logic chip and a memory chip which are vertically stacked. Specifically, the stack package 400 may be configured to include a substrate 450, a logic chip 460 stacked on the substrate 450, and a plurality of memory chips 410 and 420 sequentially stacked on a surface of the logic chip 460. The stack package 400 may further include a molding layer 470 covering the logic chip 460 and the plurality of memory chips 410 and 420. A plurality of solder balls 452 may be attached to a surface of the substrate 450 opposite to the logic chip 460 to meet predetermined requirements. Although not shown in the drawings, interconnection lines may be disposed in the substrate 450 to electrically connect the solder balls 452 to electrodes formed on a surface of the substrate 450 opposite to the solder balls 452, and the interconnection lines in the substrate 450 may include redistributed lines. The logic chip 460 stacked on the substrate 450 may include a logic chip body 461 having a first surface 461-1 and a second surface 461-2 that are opposite to each other, through electrodes 464 vertically penetrate the logic chip body 461, and an insulation layer 465 disposed on the second surface 461-2 of the logic chip body 461. In an embodiment, the insulation layer 465 may be absent. In such a case, the molding layer 470 may extend to cover the second surface 461-2 of the logic chip body 461. A plurality of electrodes 462 may be disposed on respective ones of first ends of the through electrodes 464. The electrodes 462 may be exposed at the first surface 461-1 of the logic chip body 461. A plurality of micro-bumps 467 may be respectively attached to surfaces of the electrodes 462. The micro-bumps 467 may be attached to respective ones of electrodes (not shown) disposed on a surface of the substrate 450 opposite to the solder balls 452.

The first and second memory chips 410 and 420 may be sequentially stacked on the second surface 461-2 of the logic chip body 461. Although FIG. 4 illustrates an example that two memory chips 410 and 420 are stacked on the logic chip 460, the present embodiment is not limited thereto. For example, the present embodiment is applicable to the stack packages including three or more memory chips stacked on the logic chip 460. The first memory chip 410 disposed on the logic chip 460 may include a first memory chip body 411 having a top surface 411-1 and a bottom surface 411-2 that are opposite to each other. In an embodiment, the first memory chip body 411 may include a semiconductor material, such as a silicon material. Although not shown in the drawings, an active layer in which active elements and/or passive elements are formed may be disposed in the first memory chip body 411 to be adjacent to the top surface 411-1. A plurality of first electrodes 412 may be disposed on the top surface 411-1 of the first memory chip body 411. Each of the first electrodes 412 may include a metal material such as an aluminum material or a copper material. First bumps 413 may be disposed on respective ones of the first electrodes 412 opposite to the bottom surface 411-2. In an embodiment, each of the first bumps 413 may include a metal material having a high solidity, for example, a copper material. The first bumps 413 may protrude from the top surface 411-1 of the first memory chip body 411 and top surfaces of the first electrodes 412. A horizontal cross-sectional area of a lower portion of each first bump 413 may be greater than a horizontal cross-sectional area of an upper portion thereof. For example, the horizontal cross-sectional area of each first bump 413 may gradually increase as a horizontal cross-sectional plane becomes closer to the top surface 411-1 of the first memory chip body 411. That is, a width of each first bump 413 may be gradually reduced as it becomes far from the first electrode 412. Thus, each of the first bumps 413 may have a substantially reversed circular cone shape, as illustrated in FIG. 4. The first bumps 413 may penetrate the insulation layer 465 to pierce respective ones of the through electrodes 464 of the logic chip 460, to improve a characteristic of bonding between the first memory chip body 411 and the insulation layer 465.

A plurality of first through electrodes 414 may be disposed to vertically penetrate the first memory chip body 411 between the top and bottom surfaces 411-1 and 411-2. In an embodiment, each of the first through electrodes 414 may have a uniform width or diameter. Although not shown in the drawings, an insulation layer may be disposed between each first through electrode 414 and the first memory chip body 411. Each of the first through electrodes 414 may include a conductive material having a low melting point, for example, a melting temperature of about −40 degrees Celsius to about 400 degrees Celsius. In an embodiment, each of the first through electrodes 414 may be formed of matrial selected from the group consisting of a gallium (Ga) material, an indium (In) material, a tin (Sn) material, a silver (Ag) material, a copper (Cu) material, a mercury (Hg) material, a bismuth (Bi) material, a lead (Pb) material, a gold (Au) material, a zinc (Zn) material, a potassium (K) material, a sodium (Na) material, a magnesium (Mg) material, and an aluminum (Al) material, and combinations thereof. First ends of the first through electrodes 414 may be electrically connected to respective ones of the first electrodes 412. Although FIG. 4 illustrates an example that the first through electrodes 414 directly contact the first electrodes 412, the present embodiment is not limited thereto. That is, the first through electrodes 414 may be electrically connected to respective ones of the first electrodes 412 through other interconnection lines. In such a case, the first ends of the first through electrodes 414 may directly contact the other interconnection lines. A first insulation layer 415 may be disposed on the bottom surface 411-2 of the first memory chip body 411. In an embodiment, the first insulation layer 415 may be a silicon oxide layer or a nitride layer. In such a case, a thickness of the stack package 400 may be reduced as compared with stack packages employing a non-conductive film (NCF) material or a non-conductive paste (NCP) material as the first insulation layer 415. In addition, if the first insulation layer 415 is formed of a silicon oxide layer, a difference between a thermal expansion coefficient of the first insulation layer 415 and a thermal expansion coefficient of another material (e.g., the first memory chip body 411) may be reduced to improve the reliability of the stack package 400.

The second memory chip 420 disposed on a surface of the first insulation layer 415 opposite to the first memory chip 410 may include a second memory chip body 421 having a top surface 421-1 and a bottom surface 421-2 that are opposite to each other. In an embodiment, the second memory chip body 421 may include a semiconductor material, such as a silicon material. Although not shown in the drawings, an active layer in which active elements and/or passive elements are formed may be disposed in the second memory chip body 421 to be adjacent to the top surface 421-1. A plurality of second electrodes 422 may be disposed on the top surface 421-1 of the second memory chip body 421. Each of the second electrodes 422 may include a metal material such as an aluminum material or a copper material. Second bumps 423 may be disposed on respective ones of the second electrodes 422 opposite to the bottom surface 421-2. In an embodiment, each of the second bumps 423 may include a metal material having a high solidity, for example, a copper material. The second bumps 423 may protrude from the top surface 421-1 of the second memory chip body 421 and top surfaces of the second electrodes 422. A horizontal cross-sectional area of a lower portion of each second bump 423 may be greater than a horizontal cross-sectional area of an upper portion thereof. For example, the horizontal cross-sectional area of each second bump 423 may gradually increase as a horizontal cross-sectional plane becomes closer to the top surface 421-1 of the second memory chip body 421. That is, a width of each second bump 423 may be gradually reduced as it becomes far from the second electrode 422. Thus, each of the second bumps 423 may have a substantially reversed circular cone shape, as illustrated in FIG. 4.

A plurality of second through electrodes 424 may be disposed to vertically penetrate the second memory chip body 421 between the top and bottom surfaces 421-1 and 421-2. In an embodiment, each of the second through electrodes 424 may have a uniform width or diameter. Although not shown in the drawings, an insulation layer may be disposed between each second through electrode 424 and the second memory chip body 421. Each of the second through electrodes 424 may include a conductive material having a low melting point, for example, a melting temperature of about −40 degrees Celsius to about 400 degrees Celsius. In an embodiment, each of the second through electrodes 424 may be formed of matrial selected from the group consisting of a gallium (Ga) material, an indium (In) material, a tin (Sn) material, a silver (Ag) material, a copper (Cu) material, a mercury (Hg) material, a bismuth (Bi) material, a lead (Pb) material, a gold (Au) material, a zinc (Zn) material, a potassium (K) material, a sodium (Na) material, a magnesium (Mg) material, and an aluminum (Al) material, and combinations thereof. First ends of the second through electrodes 424 may be electrically connected to respective ones of the second electrodes 422. Although FIG. 4 illustrates an example that the second through electrodes 424 directly contact the second electrodes 422, the present embodiment is not limited thereto. That is, the second through electrodes 424 may be electrically connected to respective ones of the second electrodes 422 through other interconnection lines. In such a case, the first ends of the second through electrodes 424 may directly contact the other interconnection lines. A second insulation layer 425 may be disposed on the bottom surface 421-2 of the second memory chip body 421 opposite to the top surface 421-1. In an embodiment, the second insulation layer 425 may be a silicon oxide layer or a nitride layer.

The second bumps 423 may penetrate the first insulation layer 415 to pierce respective ones of the first through electrodes 414, and the top surface 421-1 of the second memory chip body 421 may directly contact the first insulation layer 415. Since the second bumps 423 of the second memory chip 420 penetrate the first insulation layer 415 to pierce the first through electrodes 414, coherence of the second memory chip body 421 and the first insulation layer 415 for example, a characteristic of bonding between the second memory chip body 421 and the first insulation layer 415 may be improved. In particular, even though the second bumps 423 have different sizes, for example, different heights, the non-contact of the second bump 423 having a low height and the first through electrode 414 is prevented.

In an embodiment, bumps having the same structure as the first bumps 413 or the second bumps 423 may be employed instead of the micro-bumps 467. As the above described, a plurality of through electrodes may be disposed to vertically penetrate the substrate 450 and the bumps attached to the electrodes 462 may pierce into respective ones of the through electrodes penetrating the substrate 450, as described with reference to FIG. 3. That is, the substrate 450 and the logic chip 460 may be combined with each other by the same technique that the substrate 350 and the first chip 310 are combined with each other.

Figure 5:
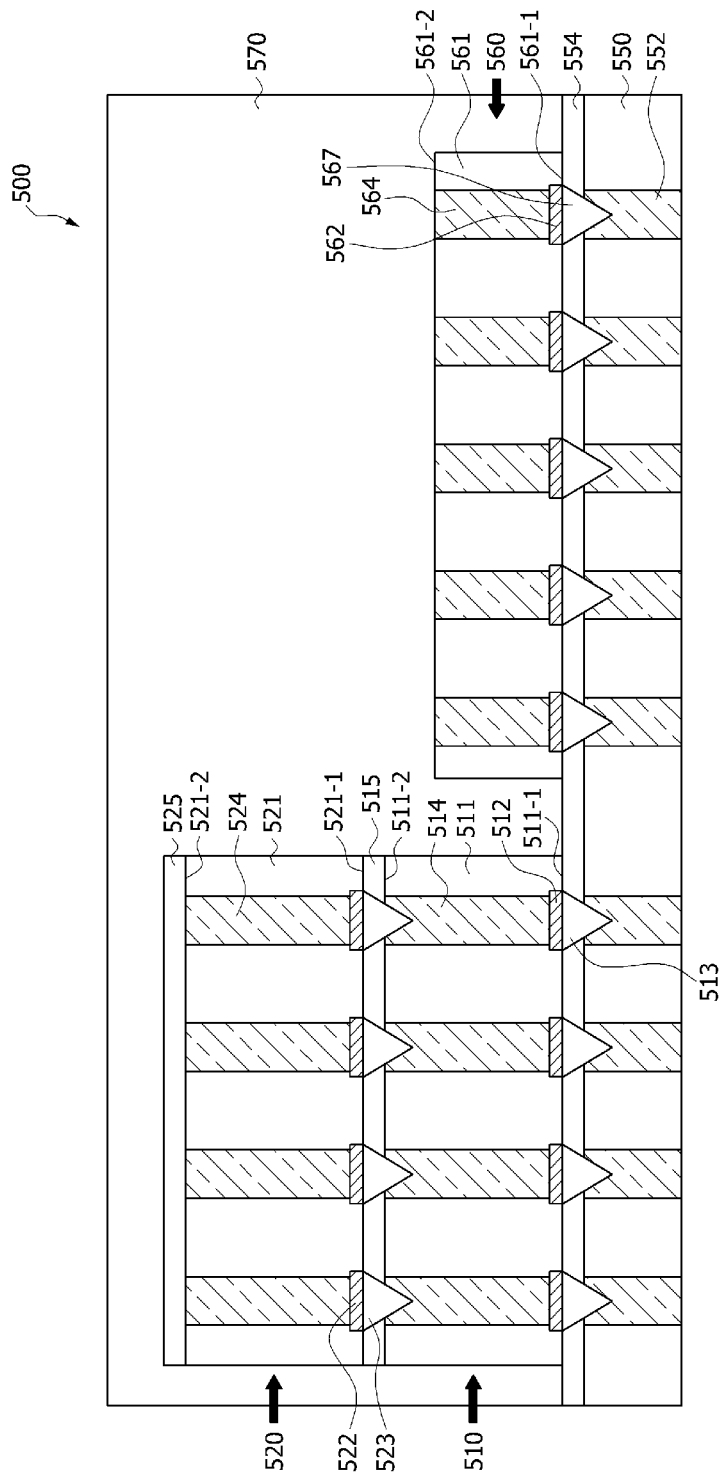
FIG. 5 is a cross-sectional view illustrating a stack package according to an embodiment of the present invention.

Referring to FIG. 5, a stack package 500 may be a system integrated circuit package including a logic chip and a memory chip which are laterally disposed. Specifically, the stack package 500 may be configured to include a substrate 550, a logic chip 560 stacked on a first region of the substrate 550, and a plurality of memory chips 510 and 520 sequentially stacked on a second region of the substrate 550. Although FIG. 5 illustrates an example that only two memory chips 510 and 520 are vertically stacked, the present embodiment is not limited thereto. For example, the present embodiment is equally applicable to the stack packages including three or more memory chips stacked on the substrate 550. The stack package 500 may further include a molding layer 570 covering the logic chip 560 and the plurality of memory chips 510 and 520. A plurality of through electrodes 552 may be disposed to vertically penetrate the substrate 550. In an embodiment, each of the through electrodes 552 may include a metal alloy material containing a metal having a relatively high conductivity and a metal having a relatively low melting point. The metal having a relatively high conductivity may include a copper material, and the metal having a relatively low melting point may include at least one of a mercury (Hg) material, a potassium (K) material, a sodium (Na) material, a tin (Sn) material, a lead (Pb) material, a magnesium (Mg) material and an aluminum (Al) material. An insulation layer 554 may be disposed on a surface of the substrate 550. In an embodiment, the insulation layer 554 may include a silicon oxide layer. The substrate 550 may be attached to a mother board or another substrate. To this end, although not shown in the drawings, bonding means such as solder balls may be attached to front surfaces of the through electrodes 552 opposite to the insulation layer 554. In an embodiment, the substrate 550 may be an interposer. In such a case, the substrate 550, that is, the interposer may be attached to another substrate.

The logic chip 560 stacked on the first region of the substrate 550 may include a logic chip body 561 having a first surface 561-1 and a second surface 561-2 that are opposite to each other, through electrodes 564 vertically penetrate the logic chip body 561, electrodes 562 disposed on the first surfaces 561-1 of logic chip body 561, and bumps 567 disposed on front surfaces of the electrodes 562 opposite to the through electrodes 564. Although not shown in the drawings, in insulation layer may be disposed on the second surface 561-2 of the logic chip body 561. The bumps 567 may penetrate the insulation layer 554 on the substrate 550 to pierce respective ones of the through electrodes 552 in the first region of the substrate 550, and the top surface 561-1 of the logic chip body 561 may directly contact the insulation layer 554. Although FIG. 5 illustrates an example that the logic chip 560 and the substrate 550 are combined with each other by the bumps 567, the present embodiment is not limited thereto. For example, the logic chip 560 and the substrate 550 may be combined with each other using solder balls or micro-bumps. In such a case, the solder balls attached to the logic chip 560 may be directly or indirectly connected to respective ones of the through electrodes 552 disposed in the substrate 550.

The first memory chip 510 may be disposed on the second region of the substrate 550. The first memory chip 510 may include a first memory chip body 511 having a top surface 511-1 and a bottom surface 511-2 that are opposite to each other. In an embodiment, the first memory chip body 511 may include a semiconductor material, such as a silicon material. Although not shown in the drawings, an active layer in which active elements and/or passive elements are formed may be disposed in the first memory chip body 511 to be adjacent to the top surface 511-1. A plurality of first electrodes 512 may be disposed on the top surface 511-1 of the first memory chip body 511. Each of the first electrodes 512 may include a metal material such as an aluminum material or a copper material. First bumps 513 may be disposed on top surfaces of the first electrodes 512 opposite to the bottom surface 511-2. In an embodiment, each of the first bumps 513 may include a metal material having a high solidity, for example, a copper material. The first bumps 513 may protrude from the top surface 511-1 of the first memory chip body 511 and the top surfaces of the first electrodes 512. A horizontal cross-sectional area of a lower portion of each first bump 513 may be greater than a horizontal cross-sectional area of an upper portion thereof. For example, the horizontal cross-sectional area of each first bump 513 may gradually increase as a horizontal cross-sectional plane becomes closer to the top surface 511-1 of the first memory chip body 511. That is, a width of each first bump 513 may be gradually reduced as it becomes far from the first electrode 512. Thus, each of the first bumps 513 may have a reversed circular cone shape, as illustrated in FIG. 5.

The first bumps 513 may penetrate the insulation layer 554 on the substrate 550 to pierce respective ones of the through electrodes 552 in the second region of the substrate 550. Since the first bumps 513 of the first memory chip 510 penetrate the insulation layer 554 to pierce the through electrodes 552 in the substrate 550, coherence of the first memory chip body 511 and the insulation layer 554, for example, a characteristic of bonding between the first memory chip body 511 and the insulation layer 554 may be improved. In particular, even though the first bumps 513 have different sizes, for example, different heights, the coherence of the first memory chip body 511 and the insulation layer 554 may be still improved because only depths of the first bumps 513 inserted into the through electrodes 552 are non-uniform and the non-uniform depths of the first bumps 513 do not affect the coherence of the first memory chip body 511 and the insulation layer 554.

A plurality of first through electrodes 514 may be disposed to vertically penetrate the first memory chip body 511 between the top and bottom surfaces 511-1 and 511-2. In an embodiment, each of the first through electrodes 514 may have a uniform width or diameter. Although not shown in the drawings, an insulation layer may be disposed between each first through electrode 514 and the first memory chip body 511. Each of the first through electrodes 514 may include a conductive material having a low melting point, for example, a melting temperature of about −40 degrees Celsius to about 400 degrees Celsius. In an embodiment, each of the first through electrodes 514 may be formed of matrial selected from the group consisting of a gallium (Ga) material, an indium (In) material, a tin (Sn) material, a silver (Ag) material, a copper (Cu) material, a mercury (Hg) material, a bismuth (Bi) material, a lead (Pb) material, a gold (Au) material, a zinc (Zn) material, a potassium (K) material, a sodium (Na) material, a magnesium (Mg) material, and an aluminum (Al) material, and combinations thereof. First ends of the first through electrodes 514 may be electrically connected to respective ones of the first electrodes 512. Although FIG. 5 illustrates an example that the first through electrodes 514 directly contact the first electrodes 512, the present embodiment is not limited thereto. That is, the first through electrodes 514 may be electrically connected to respective ones of the first electrodes 512 through other interconnection lines. In such a case, the first ends of the first through electrodes 514 may directly contact the other interconnection lines. A first insulation layer 515 may be disposed on the bottom surface 511-2 of the first memory chip body 511. In an embodiment, the first insulation layer 515 may be a silicon oxide layer or a nitride layer. In such a case, a thickness of the stack package 500 may be reduced as compared with stack packages employing a non-conductive film (NCF) material or a non-conductive paste (NCP) material as the first insulation layer 515. In addition, if the first insulation layer 515 is formed of a silicon oxide layer, a difference between a thermal expansion coefficient of the first insulation layer 515 and a thermal expansion coefficient of another material (e.g., the first memory chip body 511) may be reduced to improve the reliability of the stack package 500.

The second memory chip 520 may be disposed on a surface of the first insulation layer 515 opposite to the first memory chip 510. The second memory chip 520 may include a second memory chip body 521 having a top surface 521-1 and a bottom surface 521-2 that are opposite to each other. In an embodiment, the second memory chip body 521 may include a semiconductor material, such as a silicon material. Although not shown in the drawings, an active layer in which active elements and/or passive elements are formed may be disposed in the second memory chip body 521 to be adjacent to the top surface 521-1. A plurality of second electrodes 522 may be disposed on the top surface 521-1 of the second memory chip body 521. Each of the second electrodes 522 may include a metal material such as an aluminum material or a copper material. Second bumps 523 may be disposed on respective ones of the second electrodes 522. In an embodiment, each of the second bumps 523 may include a metal material having a high solidity, for example, a copper material. The second bumps 523 may protrude from the top surface 521-1 of the second memory chip body 521 and top surfaces of the second electrodes 522. A horizontal cross-sectional area of a lower portion of each second bump 523 may be greater than a horizontal cross-sectional area of an upper portion thereof. For example, the horizontal cross-sectional area of each second bump 523 may gradually increase as a horizontal cross-sectional plane becomes closer to the top surface 521-1 of the second memory chip body 521. That is, a width of each second bump 523 may be gradually reduced as it becomes far from the second electrode 522. Thus, each of the second bumps 523 may have a substantially reversed circular cone shape, as illustrated in FIG. 5.

A plurality of second through electrodes 524 may be disposed to vertically penetrate the second memory chip body 521 between the top and bottom surfaces 521-1 and 521-2. In an embodiment, each of the second through electrodes 524 may have a uniform width or diameter. Although not shown in the drawings, an insulation layer may be disposed between each second through electrode 524 and the second memory chip body 521. Each of the second through electrodes 524 may include a conductive material having a low melting point, for example, a melting temperature of about −40 degrees Celsius to about 400 degrees Celsius. In an embodiment, each of the second through electrodes 524 may be formed of matrial selected from the group consisting of a gallium (Ga) material, an indium (In) material, a tin (Sn) material, a silver (Ag) material, a copper (Cu) material, a mercury (Hg) material, a bismuth (Bi) material, a lead (Pb) material, a gold (Au) material, a zinc (Zn) material, a potassium (K) material, a sodium (Na) material, a magnesium (Mg) material, and an aluminum (Al) material, and combinations thereof. First ends of the second through electrodes 524 may be electrically connected to respective ones of the second electrodes 522. Although FIG. 5 illustrates an example that the second through electrodes 524 directly contact the second electrodes 522, the present embodiment is not limited thereto. That is, the second through electrodes 524 may be electrically connected to respective ones of the second electrodes 522 through other interconnection lines. In such a case, the first ends of the second through electrodes 524 may directly contact the other interconnection lines. A second insulation layer 525 may be disposed on the bottom surface 521-2 of the second memory chip body 521 opposite to the top surface 521-1. In an embodiment, the second insulation layer 525 may be a silicon oxide layer or a nitride layer.

The second bumps 523 may penetrate the first insulation layer 515 to pierce respective ones of the first through electrodes 514, and the top surface 521-1 of the second memory chip body 521 may directly contact the first insulation layer 515. Since the second bumps 523 of the second memory chip 520 penetrate the first insulation layer 515 to pierce the first through electrodes 514, coherence of the second memory chip body 521 and the first insulation layer 515, for example, a characteristic of bonding between the second memory chip body 521 and the first insulation layer 515 may be improved. In particular, even though the second bumps 523 have different sizes, for example, different heights, the non-contact of the second bump 523 having a low height and the first through electrode 514 is prevented.

Figure 6:
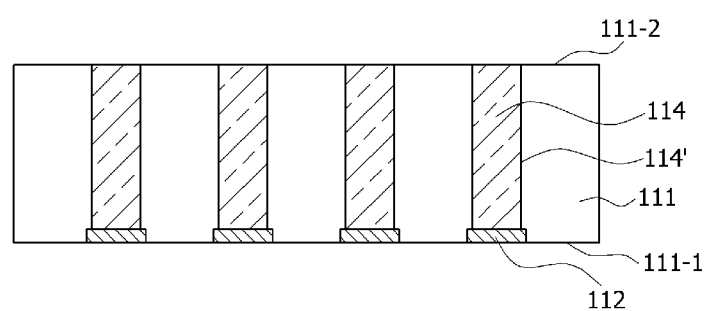
FIGS. 6, 7, 8 and 9 are cross-sectional views illustrating a method of fabricating a stack package according to an embodiment of the present invention.

Referring to FIG. 6, a first chip body 111 may be provided to have first electrodes 112 and first through electrodes 114. The first chip body 111 may include a top surface 111-1 and a bottom surface 111-2 that are opposite to each other. In an embodiment, the first chip body 111 may include a semiconductor material, such as a silicon material. In a embodiment, the first chip body 111 may correspond to a wafer including a plurality of unit devices as described with reference to FIG. 2. Even in such a case, the present embodiment is equally applicable to a method of fabricating a stack package including the wafer. Although not shown in the drawings, an active layer in which active elements and/or passive elements are formed may be disposed in the first chip body 111 to be adjacent to the top surface 111-1. The first electrodes 512 may be formed on the top surface 111-1 of the first chip body 111 to be electrically connected to the first through electrodes 114. In an embodiment, the first electrodes 112 may be formed of a metal layer such as an aluminum layer or a copper layer. Although not shown in the drawings, an insulation layer exposing the first electrodes 112 may be formed on the top surface 111-1 of the first chip body 111. The insulation layer exposing the first electrodes 112 may be formed of a silicon oxide layer or a nitride layer.

The first through electrodes 114 may be formed to fill via holes 114' penetrating the first chip body 111. In an embodiment, each of the first through electrodes 114 may be formed to have a uniform diameter in the first chip body 111. Although not shown in the drawings, the first through electrodes 114 may be formed to be electrically connected to the first electrodes 112 through other interconnection lines. In addition, an insulation layer may be formed between the first through electrodes 114 and the first chip body 111. In such a case, the insulation layer between the first through electrodes 114 and the first chip body 111 may be formed of a silicon oxide layer. Moreover, a diffusion barrier layer may be formed between the first through electrodes 114 and the first chip body 111. The diffusion barrier layer may prevent atoms in the first through electrodes 114 from being diffused into the first chip body 111. In an embodiment, the diffusion barrier layer may be formed of a titanium nitride (TiN) layer or a tantalum nitride (TaN) layer.

The first through electrodes 114 may be formed of a conductive material having a low melting point. In an embodiment, the first through electrodes 114 may be formed of a metal layer having a relatively low melting point, for example, a melting temperature of about −40 degrees Celsius to about 400 degrees Celsius. For example, the first through electrodes 114 may be formed of matrial selected from the group consisting of a gallium (Ga) material, an indium (In) material, a tin (Sn) material, a silver (Ag) material, a copper (Cu) material, a mercury (Hg) material, a bismuth (Bi) material, a lead (Pb) material, a gold (Au) material, a zinc (Zn) material, a potassium (K) material, a sodium (Na) material, a magnesium (Mg) material, and an aluminum (Al) material, and combinations thereof. In an embodiment, the first through electrodes 114 may be formed using an electroplating technique. First surfaces of the first through electrodes 114 may be covered with the first electrodes 112 at the top surface 111-1 of the first chip body 111, and second surfaces of the first through electrodes 114 may be exposed at the bottom surface 111-2 of the first chip body 111.

Figure 7:
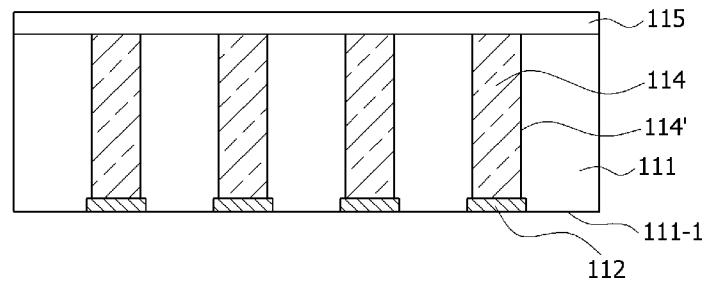

Referring to FIG. 7, a first insulation layer 115 may be formed to cover the bottom surface 111-2 of the first chip body 111 and the second surfaces of the first through electrodes 114. In an embodiment, the first insulation layer 115 may be formed of a polymer layer. Alternatively, the first insulation layer 115 may be formed of a silicon oxide layer. In such a case, the first insulation layer 115 when the first insulation layer 115 is formed of a silicon oxide layer can be formed to be thinner than the first insulation layer 115 when the first insulation layer 115 is formed of a non-conductive film (NCF) material or a non-conductive paste (NCP) material. In addition, if the first insulation layer 115 is formed of a silicon oxide layer, a difference between a thermal expansion coefficient of the first insulation layer 115 and a thermal expansion coefficient of the first chip body 111 (e.g., a silicon material) may be reduced to improve the reliability of a stack package fabricated according to the present embodiment. The silicon oxide layer used as the first insulation layer 115 may be formed using a general deposition process.

Figure 8:
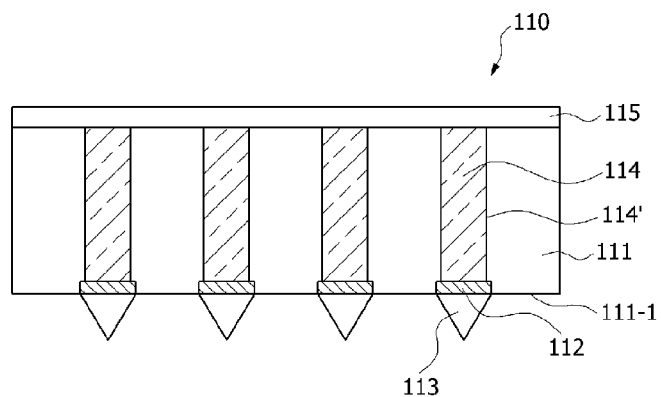

Referring to FIG. 8, first bumps 113 may be formed on respective ones of the first electrodes 112. The first bumps 113 may be formed such that a horizontal cross-sectional area of each first bump 113 may gradually increase as a horizontal cross-sectional plane becomes closer to the top surface 111-1 of the first chip body 111. That is, the first bumps 113 may be formed such that a width of each first bump 113 may be gradually reduced as it becomes far from the first electrode 112. As a result, each of the first bumps 113 may be formed to have a substantially reversed circular cone shape. In an embodiment, the first bumps 113 may be formed of a metal material having a high solidity, for example, a copper material. The first bumps 113 may be formed using an electroplating technique.

Figure 9:
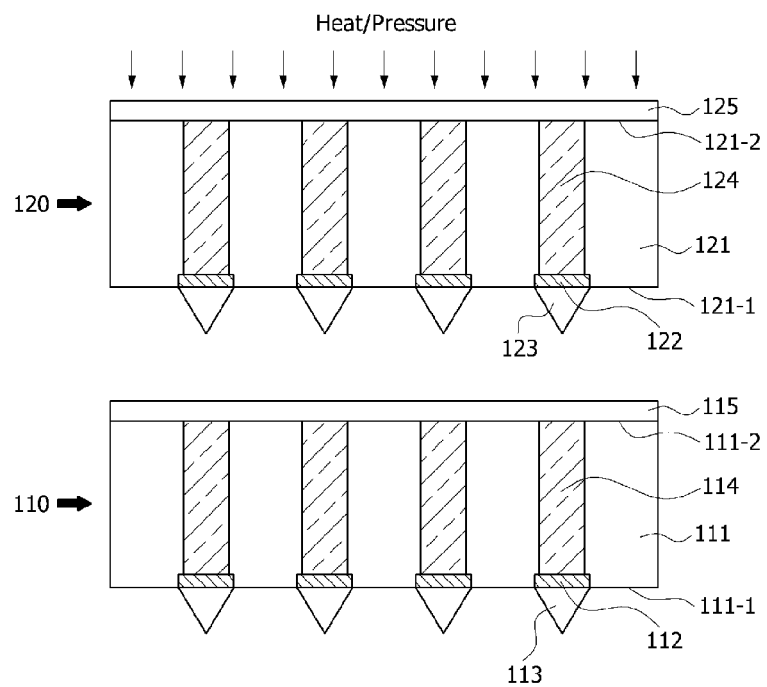

Referring to FIG. 9, a second chip 120 may be disposed over a backside surface of a first chip 110 fabricated using the processes described with reference to FIGS. 6, 7 and 8. That is, the second chip 120 may be put on a surface of the first insulation layer 115 opposite to the first chip body 111 to be aligned with the first chip 110. In an embodiment, the second chip 120 may be formed to have the same structure as the first chip 110. That is, the second chip 120 may be formed to include a second chip body 121 having a top surface 121-1 and a bottom surface 121-2 that are opposite to each other, second through electrodes 124 vertically penetrating the second chip body 121, second electrodes 122 contacting first surfaces of the second through electrodes 124 to be adjacent to the top surface 121-1, second bumps 123 disposed on respective ones of the second electrodes 122 to have a substantially reversed circular cone shape, and a second insulation layer 125 disposed on the bottom surface 121-2 of the second chip body 121. As such, if the second chip 120 has the same structure as the first chip 110, the second chip 120 may be formed using the same processes as described with reference to FIGS. 6, 7 and 8. However, in an embodiment, the second chip 120 may be formed to have a different structure from the first chip 110. For example, the second chip 120 may be formed without the second through electrodes 124.

After the second chip 120 is aligned with the first chip 110, the first chip 110 may be heated and the second chip 120 may be pressurized as indicated by the arrows in FIG. 9 such that the first and second chips 110 and 120 are combined with each other. Specifically, the first chip 110 may be heated to a melting temperature of the first through electrodes 114 or higher such that the first through electrodes 114 have a liquid state or a quasi-liquid state. For example, the first chip 110 may be heated to a temperature of about −40 degrees Celsius to about 400 degrees Celsius such that the first through electrodes 114 have the liquid state or the quasi-liquid state. While the first chip 110 is heated, the second chip 120 may be pressurized such that the second bumps 123 penetrate the first insulation layer 115 and pierce the first through electrodes 114 having a liquid state or a quasi-liquid state, as illustrated in FIG. 1. Heating the first chip 110 and pressurizing the second chip 120 may be performed until the top surface 121-1 of the second chip body 121 sufficiently contacts an entire surface of the first insulation layer 115. During the first and second chips 110 and 120 are attached with each other, the first insulation layer 115 may prevent the first through electrodes 114 having a liquid state or a quasi-liquid state from flowing out of the via holes 114'.

Since the second bumps 123 of the second chip 120 penetrate the first insulation layer 115 to pierce the first through electrodes 114 of the first chip 110, coherence, e.g., a characteristic of bonding of the second chip body 121 and the first insulation layer 115 may be improved. In particular, even though the second bumps 123 are formed to have different sizes, for example, different heights, the coherence of the second chip body 121 and the first insulation layer 115 may be still improved because only depths of the second bumps 123 inserted into the first through electrodes 114 are non-uniform and the non-uniform depths of the second bumps 123 do not affect the coherence of the second chip body 121 and the first insulation layer 115.

Figure 10:
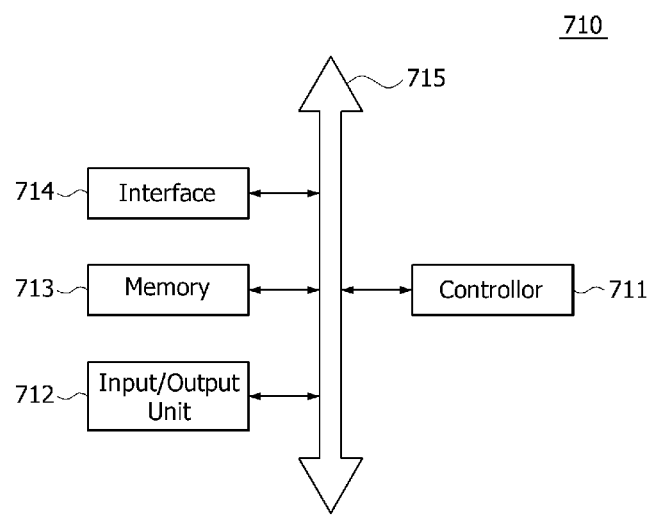
FIG. 10 is a block diagram illustrating an electronic system including a stack package according to an embodiment of the present invention.

Referring to FIG. 10, the stack package in accordance with an embodiment may be applied to an electronic system 710. The electronic system 710 may include a controller 711, an input/output unit 712, and a memory 713. The controller 711, the input/output unit 712 and the memory 713 may be electrically coupled with one another through a bus 715 providing a path through which data are transmitted.

For example, the controller 711 may include at least any one of at least one microprocessor, at least one digital signal processor, at least one microcontroller, and logic devices capable of performing the same functions as these components. The controller 711 or the memory 713 may include at least any one of the stack packages according to the embodiments of the present invention. The input/output unit 712 may include at least one selected among a keypad, a keyboard, a display device, a touch screen and so forth. The memory 713 is a device for storing data. The memory 713 may store data and/or commands to be executed by the controller 711, and the likes.

The memory 713 may include a volatile memory device such as a DRAM and/or a nonvolatile memory device such as a flash memory. For example, a flash memory may be mounted to an information processing system such as a mobile terminal or a desk top computer. The flash memory may constitute a solid state disk (SSD). In this case, the electronic system 710 may stably store a large amount of data in a flash memory system.

The electronic system 710 may further include an interface 714 configured to transmit and receive data to and from a communication network. The interface 714 may be a wired or wireless type. For example, the interface 714 may include an antenna or a wired or wireless transceiver.

The electronic system 710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

In the case where the electronic system 710 is an equipment capable of performing wireless communication, the electronic system 710 may be used in a communication system such as of CDMA (code division multiple access), GSM (global system for mobile communications), NADC (north American digital cellular), E-TDMA (enhanced-time division multiple access), WCDMA (wideband code division multiple access), CDMA2000, LTE (long term evolution) and Wibro (wireless broadband Internet).

Figure 11:
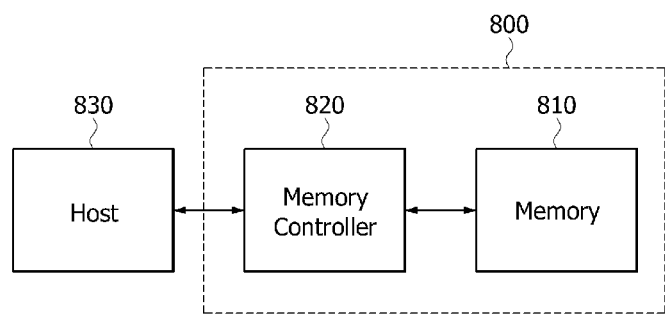
FIG. 11 is a block diagram illustrating a memory card including a stack package according to an embodiment of the present invention.

Referring to FIG. 11, the stack package in accordance with the embodiments may be provided in the form of a memory card 800. For example, the memory card 800 may include a memory 810 such as a nonvolatile memory device and a memory controller 820. The memory 810 and the memory controller 820 may store data or read stored data.

The memory 810 may include at least any one among nonvolatile memory devices to which the packaging technologies of the embodiments of the present invention are applied. The memory controller 820 may control the memory 810 such that stored data is read out or data is stored in response to a read/write request from a host 830.

The embodiments have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A stack package comprising:
a first chip configured to include a first chip body having a top surface and a bottom surface, first through electrodes penetrating the first chip body, an insulation layer disposed on the bottom surface of the first chip body, and first bumps disposed on the top surface of the first chip body; and
a second chip configured to include a second chip body having a top surface and a bottom surface, and second bumps disposed on the top surface of the second chip body, wherein the first and second chips are vertically stacked such that the top surface of the second chip body is directly attached to the insulation layer and the second bumps of the second chip penetrate the insulation layer of the first chip to pierce the first through electrodes of the first chip.

2. The stack package of claim 1, wherein a horizontal cross-sectional area of an upper portion of each of the second bumps is less than a horizontal cross-sectional area of a lower portion thereof.

3. The stack package of claim 1, wherein each of the second bumps has a circular cone shape.

4. The stack package of claim 1, wherein each of the first through electrodes includes a conductive material having a low melting temperature of about −40 degrees Celsius to about 400 degrees Celsius.

5. The stack package of claim 1, wherein each of the first through electrodes is formed of material selected from the group consisting of a gallium (Ga) material, an indium (In) material, a tin (Sn) material, a silver (Ag) material, a copper (Cu) material, a mercury (Hg) material, a bismuth (Bi) material, a lead (Pb) material, a gold (Au) material, a zinc (Zn) material, a potassium (K) material, a sodium (Na) material, a magnesium (Mg) material, and an aluminum (Al) material, and combinations thereof.

6. The stack package of claim 1, wherein each of the first through electrodes has a uniform diameter.

7. The stack package of claim 1, wherein each of the first and second chips corresponds to a wafer including a plurality of devices.

8. The stack package of claim 1, wherein the first insulation layer is a non-conductive film (NCF) or a non-conductive paste (NCP).

9. The stack package of claim 1, wherein the first insulation layer is a silicon oxide layer or a nitride layer.

10. The stack package of claim 1, wherein each of the second bumps has different height.

* * * * *